United States Patent
Shah

(10) Patent No.: US 9,324,441 B1
(45) Date of Patent: Apr. 26, 2016

(54) FAST ADAPTIVE TRIMMING OF OPERATING PARAMETERS FOR NON-VOLATILE MEMORY DEVICES

(71) Applicant: SanDisk Technologies Inc., Plano, TX (US)

(72) Inventor: Grishma Shah, Milptas, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/600,693

(22) Filed: Jan. 20, 2015

(51) Int. Cl.
```
G11C 7/10      (2006.01)
G11C 16/16     (2006.01)
G11C 16/26     (2006.01)
G11C 16/34     (2006.01)
```
(52) U.S. Cl.
CPC ........ *G11C 16/16* (2013.01); *G11C 7/10* (2013.01); *G11C 16/26* (2013.01); *G11C 16/3459* (2013.01)

(58) Field of Classification Search
CPC .................................. G11C 7/10; G11C 11/34
USPC .............. 365/189.05, 185.17, 185.12, 189.17
See application file for complete search history.

(56) References Cited

U.S. PATENT DOCUMENTS

| | | | |
|---|---|---|---|
| 2006/0140007 A1 | 6/2006 | Cernea et al. | |
| 2012/0182803 A1* | 7/2012 | Shirakawa | G11C 16/0483 365/185.11 |
| 2015/0324148 A1* | 11/2015 | Achtenberg | G06F 12/00 711/103 |

\* cited by examiner

*Primary Examiner* — Vu Le

(74) *Attorney, Agent, or Firm* — Davis Wright Tremaine LLP

(57) ABSTRACT

As memory devices scale down, the controller may use different sets of trim values for read/program/erase operations for different blocks based on the amount of wear a block has experienced. To facilitate this process, when the controller issues series of commands, a set of parameters for the operations are initially transferred into latches that are normally used for user data, after which they are transferred into the registers used to hold the parameters while the operation is performed. This allows for read, write and erase parameters to be updated with minimal time penalty and on the fly, allowing for these trim values to be changed more frequently and without the need to add extra registers on the memory circuit.

31 Claims, 12 Drawing Sheets

Programming into four states represented by a 2-bit code

FAST ADAPTIVE TRIMMING OF OPERATING PARAMETERS FOR NON-VOLATILE MEMORY DEVICES

BACKGROUND

This application relates to the operation of re-programmable non-volatile memory circuits such as semiconductor flash memory and to the setting of values for operating parameters for such systems.

The operation of non-volatile memory devices, such as flash NAND memory circuits, depends upon a large number of parameters. For example, the read, write and erase operations of these devices use a number of different voltage levels. Additionally, there are parameters associated with the number of loops used in various operations and with when to begin, or end, different operations or sub-operations. As devices scale down, the controller of a memory system using such circuits may need to use different sets of trim values for different blocks based on the amount of wear the block has been through, in order to meet endurance and performance requirements. Consequently, the number of parameters/trim values that need to be updated for read, program, and erase operations is increasing with every generation. These different values of these parameters can be maintained on the memory chip itself, but at the price of devoting a large area penalty; alternate, they can be kept on the controller and transferred to the memory circuit as needed, which result in a performance penalty. Consequently, it would be useful to be able to maintain the needed parameters and supply these as needed to the memory circuit, while also minimizing the effects of this on the performance of the memory system.

SUMMARY

A non-volatile memory circuit includes: an array of non-volatile memory cells connected along bit lines; a data bus; read/write/erase circuitry connected to the array, including data latches connectable to the bit lines and data bus for transfer of data between the data bus and the array; registers for storing operating parameters; and control circuitry connected to the read/write/erase circuitry. In response to receiving a specified command sequence including a set of operating parameters, the memory circuit loads the received set of operating parameters into the data latches and subsequently transfers the received set of operating parameters from the data latches to the registers prior to executing by the read/write/erase circuitry of a subsequent portion of the specified command sequence using the received set of operating parameters.

A non-volatile memory system includes a memory circuit and a memory controller circuit. The memory circuit includes: an array of non-volatile memory cells connected along bit lines; a data bus; read/write/erase circuitry connected to the array, including data latches connectable to the bit lines and data bus for transfer of data between the data bus and the array; registers for storing operating parameters; and read/write/erase control logic connected to the read/write/erase circuitry. The memory controller circuit is connected to the memory circuit to control the transfer of data between the memory circuit and a host connected to the memory system and to manage the storage of data on the memory circuit. In response to memory circuit receiving from the memory controller circuit a specified command sequence including a set of operating parameters, the memory circuit loads the received set of operating parameters into the data latches and subsequently transfers the received set of operating parameters from the data latches to the registers prior to executing by the read/write/erase circuitry of a subsequent portion of the specified command sequence using the received set of operating parameters.

Various aspects, advantages, features and embodiments are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

Memory System

Figure 1:
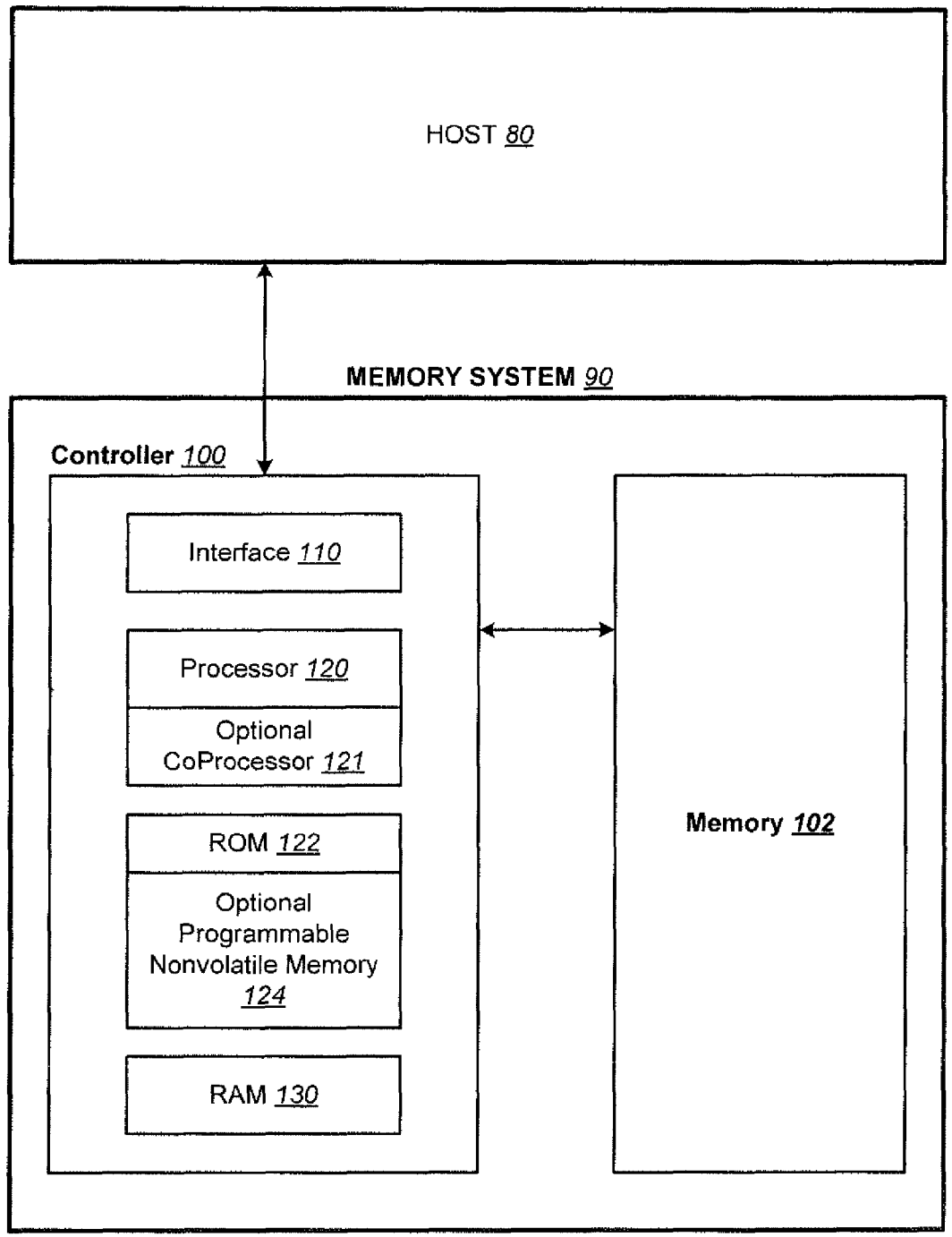
FIG. 1 illustrates schematically the main hardware components of a memory system suitable for implementing various aspects described in the following.

FIG. 1 illustrates schematically the main hardware components of a memory system suitable for implementing the following. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

With respect to the memory section 102, semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

Figure 2:
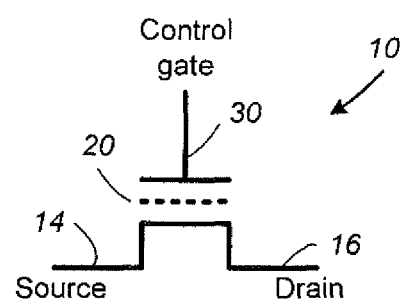
FIG. 2 illustrates schematically a non-volatile memory cell.

It will be recognized that the following is not limited to the two dimensional and three dimensional exemplary structures described but cover all relevant memory structures within the spirit and scope as described herein Physical Memory Structure FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Also, examples of memory devices utilizing dielectric storage elements.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
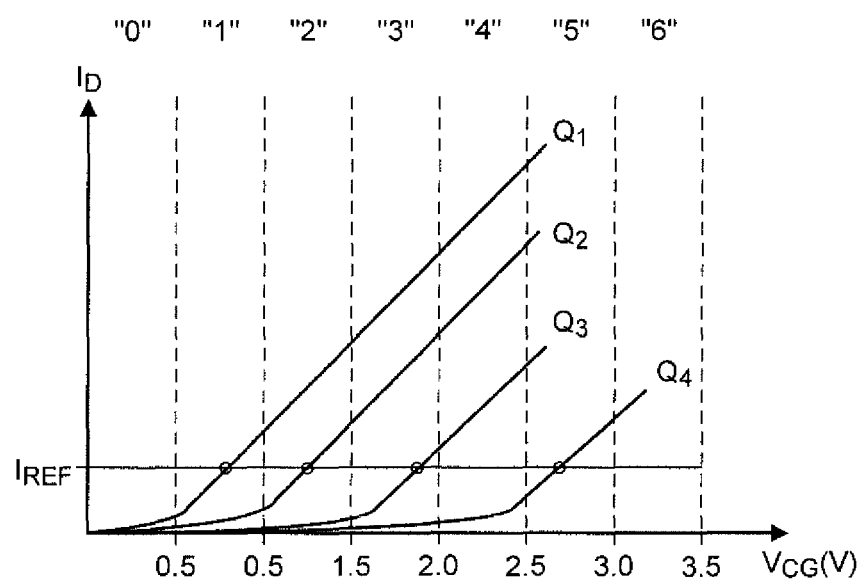
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4:
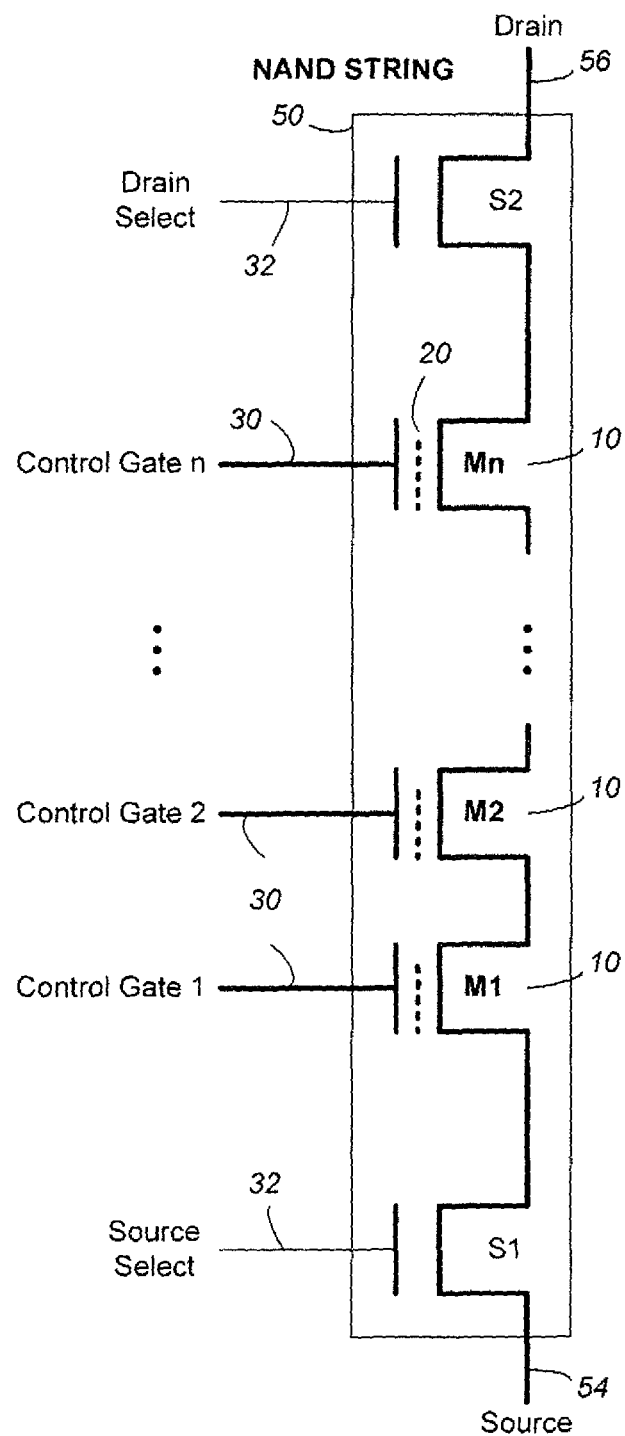
FIG. 4 illustrates schematically a string of memory cells organized into a NAND string.

FIG. 4 illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 5). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 5, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell.

Figure 5:
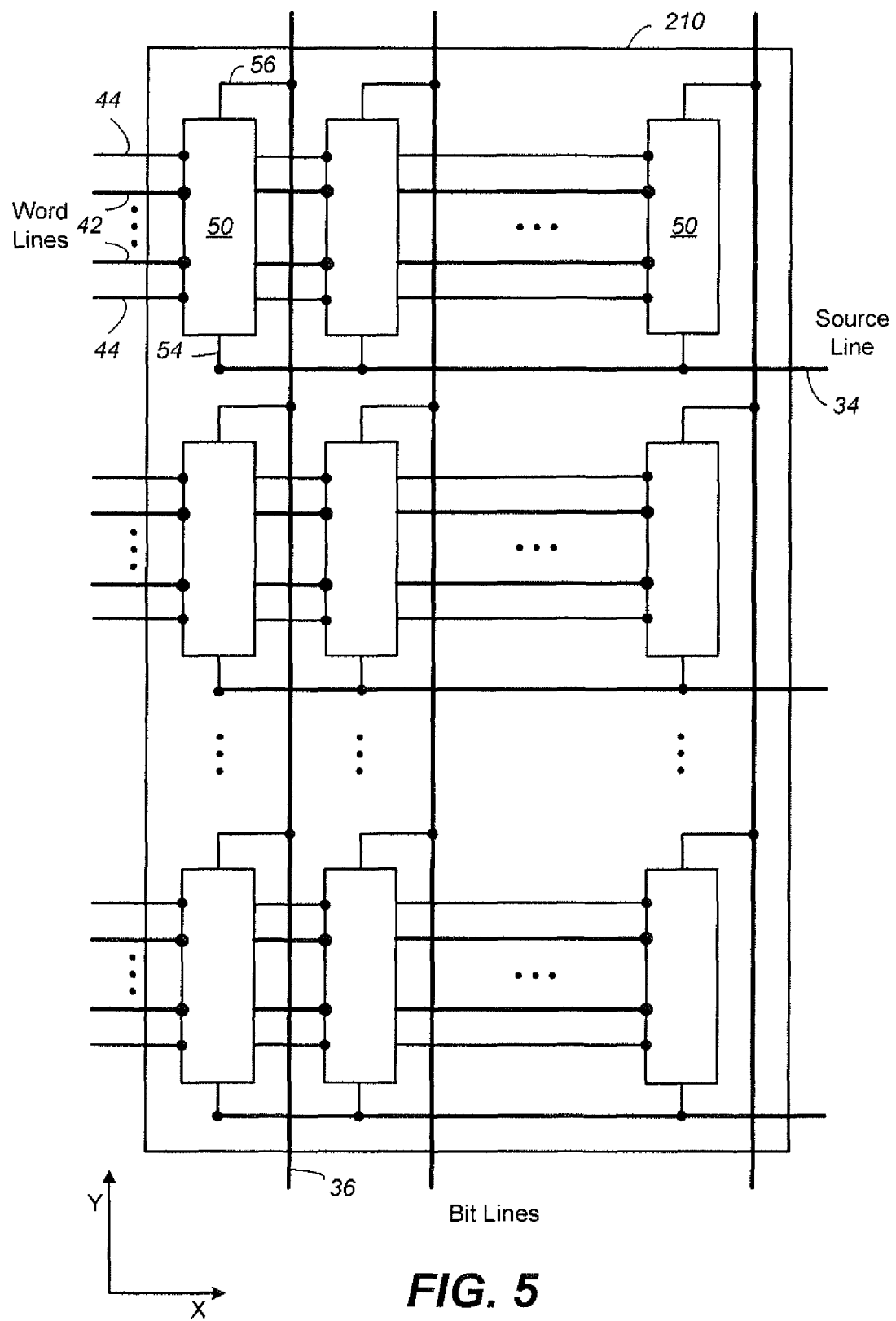
FIG. 5 illustrates an example of a NAND array 210 of memory cells, constituted from NAND strings 50 such as that shown in FIG. 4.

FIG. 5 illustrates an example of a NAND array 210 of memory cells, constituted from NAND strings 50 such as that shown in FIG. 4. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 6:
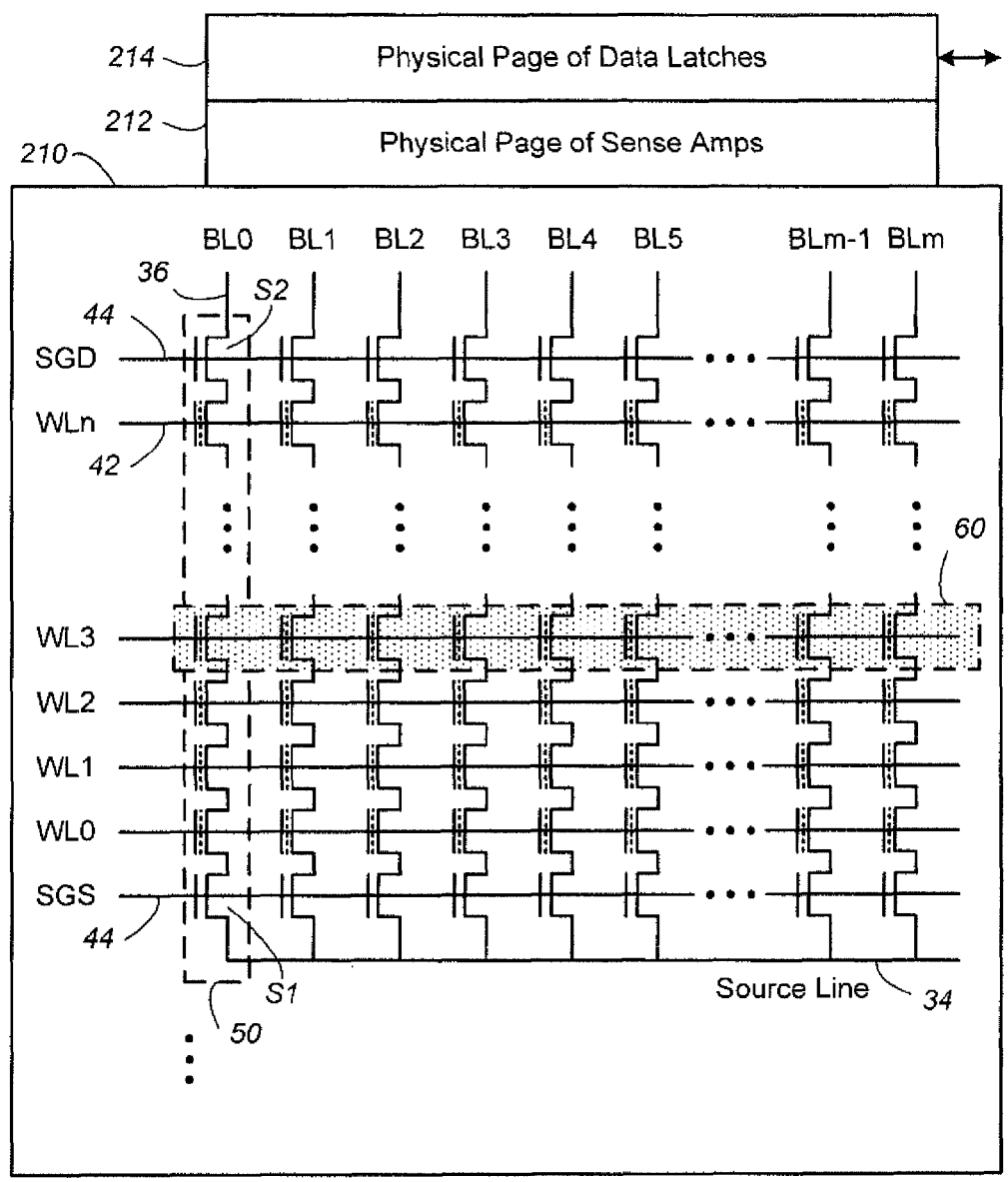
FIG. 6 illustrates a page of memory cells, organized in the NAND configuration, being sensed or programmed in parallel.

FIG. 6 illustrates a page of memory cells, organized in the NAND configuration, being sensed or programmed in parallel. FIG. 6 essentially shows a bank of NAND strings 50 in the memory array 210 of FIG. 5, where the detail of each NAND string is shown explicitly as in FIG. 4. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One difference between flash memory and other of types of memory is that a cell is programmed from the erased state. That is, the floating gate is first emptied of charge. Programming then adds a desired amount of charge back to the floating gate. It does not support removing a portion of the charge from the floating gate to go from a more programmed state to a lesser one. This means that updated data cannot overwrite existing data and is written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

Figure 7:
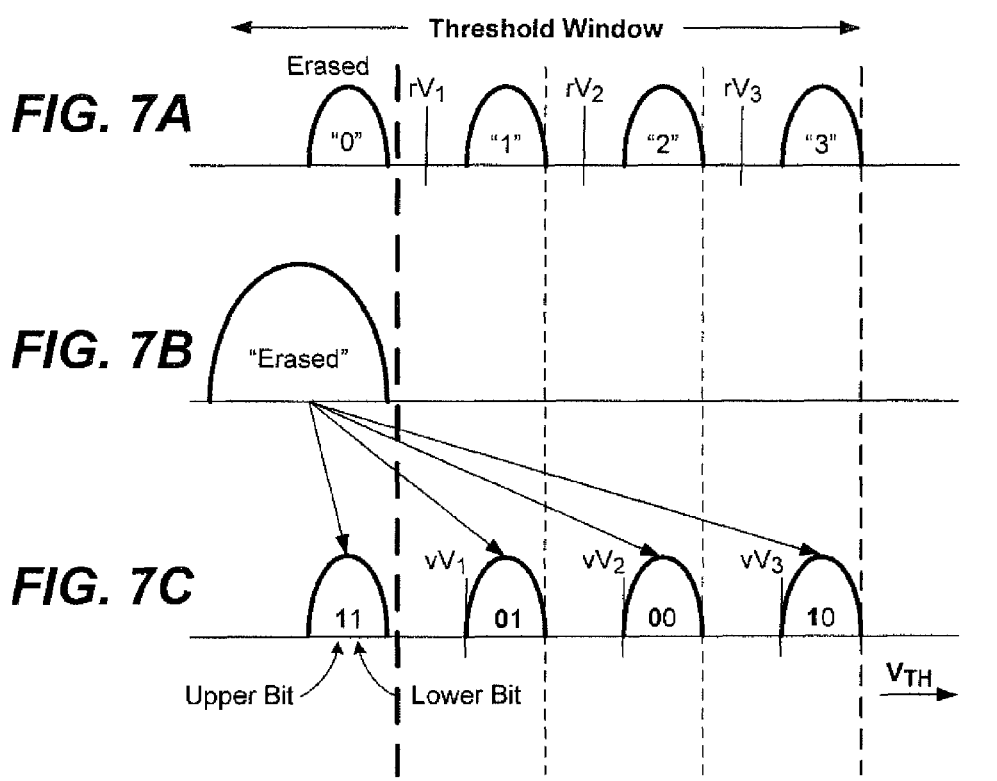
FIGS. 7A-7C illustrate an example of programming a population of memory cells.

FIG. 7A-7C illustrate an example of programming a population of 4-state memory cells. FIG. 7A illustrates the population of memory cells programmable into four distinct distributions of threshold voltages respectively representing memory states "0", "1", "2" and "3". FIG. 7B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "1", "2" and "3" or remain un-programmed in the "erased" state. As the memory gets more programming, the initial distribution of the "erased" state as shown in FIG. 7B will become narrower and the erased state is represented by the "0" state.

A 2-bit code having a lower bit and an upper bit can be used to represent each of the four memory states. For example, the "0", "1", "2" and "3" states are respectively represented by "11", "01", "00" and '10'. The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND Structures

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings.

Figure 8:
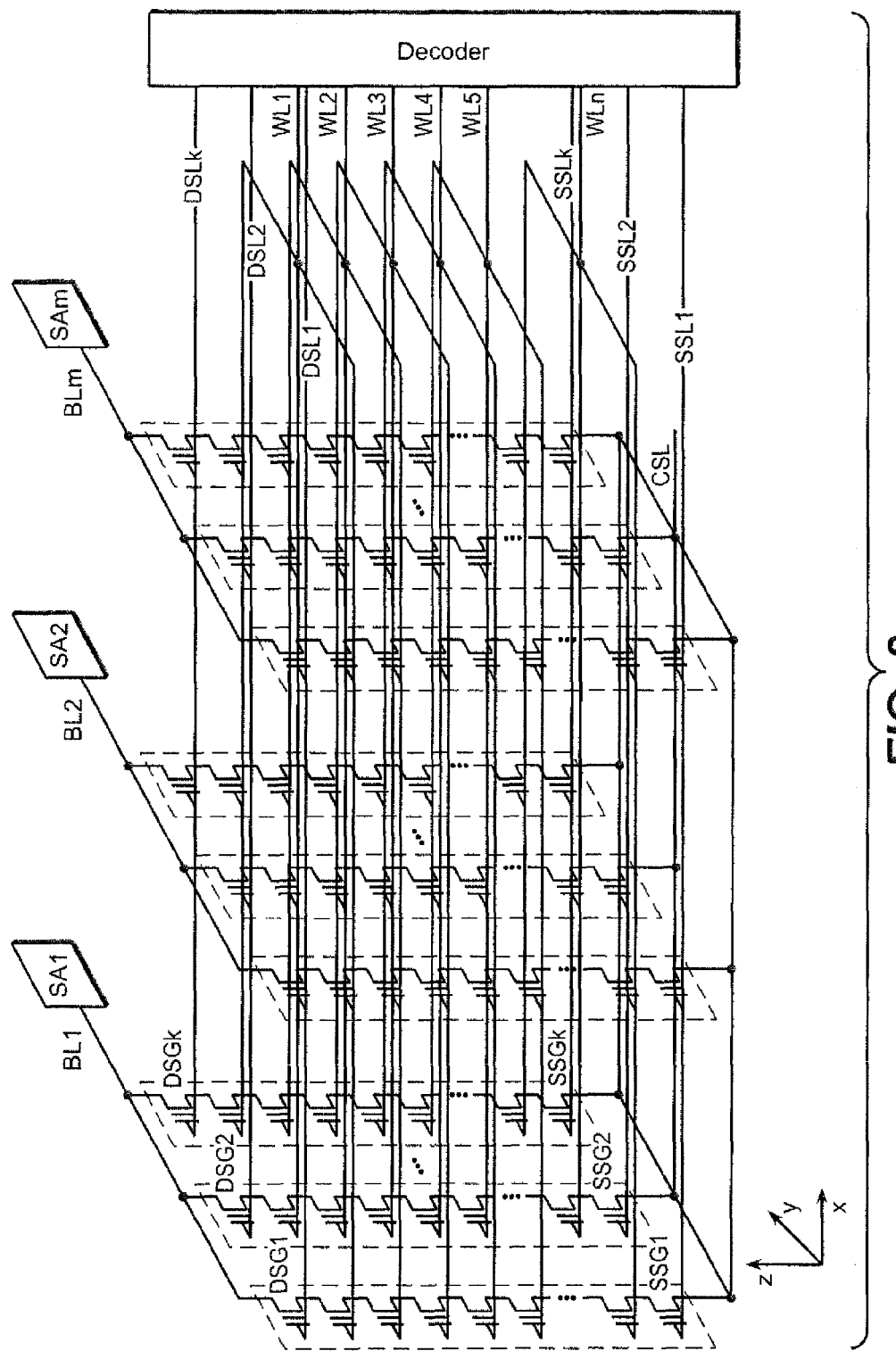
FIG. 8 shows an example of a physical structure of a 3-D NAND string.

FIG. 8 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 8 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

A 3D NAND array can, loosely speaking, be formed tilting up the respective structures 50 and 210 of FIGS. 5 and 6 to be perpendicular to the x-y plane. In this example, each y-z plane corresponds to the page structure of FIG. 6, with m such plane at differing x locations. The (global) bit lines, BL1-$m$, each run across the top to an associated sense amp SA1-$m$. The word lines, WL1-$n$, and source and select lines SSL1-$n$ and DSL1-$n$, then run in x direction, with the NAND string connected at bottom to a common source line CSL.

Figure 9:
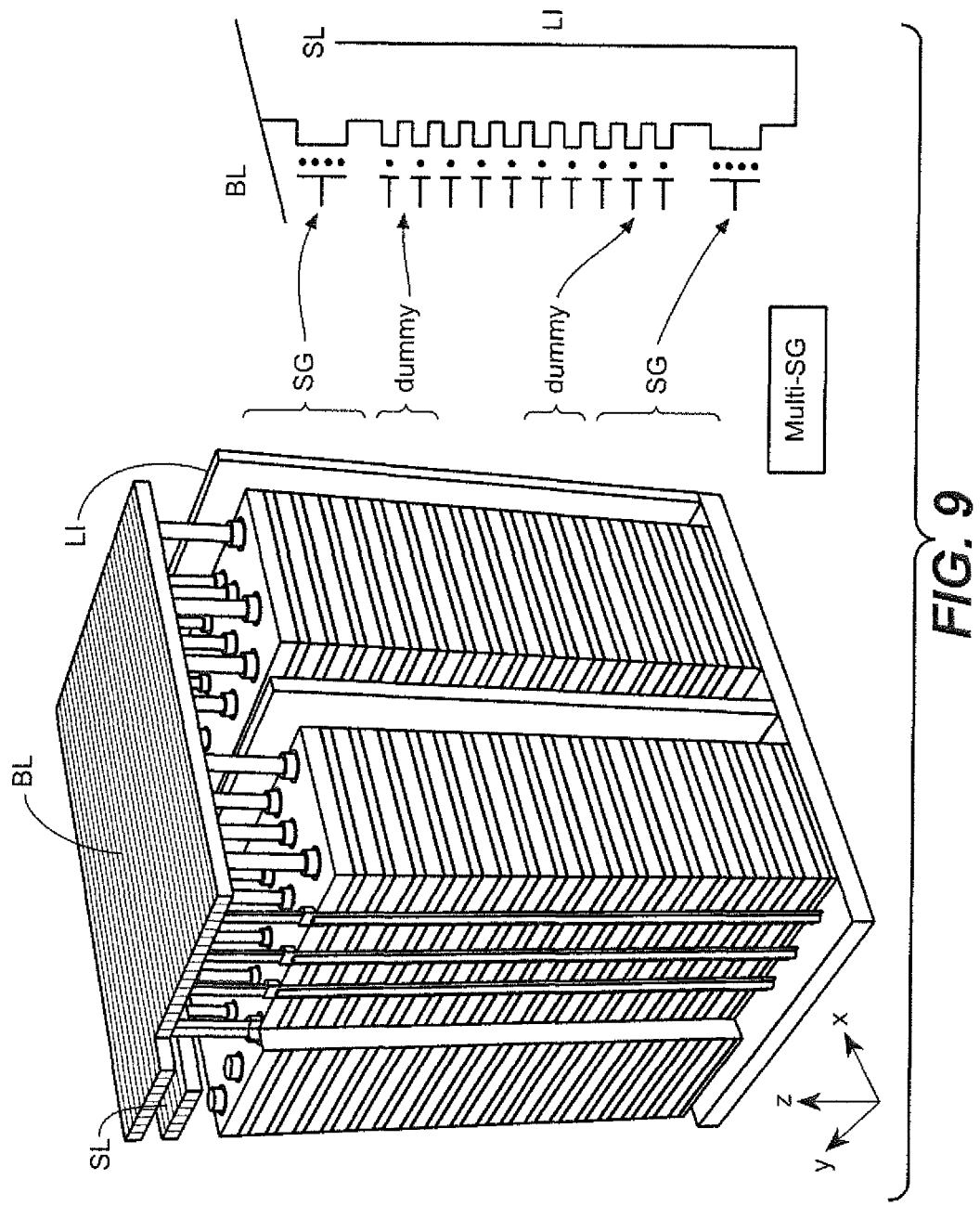
FIGS. 9-12 look at a particular monolithic three dimensional (3D) memory array of the NAND type (more specifically of the "BiCS" type).

FIGS. 9-12 look at a particular monolithic three dimensional (3D) memory array of the NAND type (more specifically of the "BiCS" type), where one or more memory device levels are formed above a single substrate, in more detail. FIG. 9 is an oblique projection of part of such a structure, showing a portion corresponding to two of the page structures in FIG. 5, where, depending on the embodiment, each of these could correspond to a separate block or be different "fingers" of the same block. Here, instead to the NAND strings lying in a common y-z plane, they are squashed together in the y direction, so that the NAND strings are somewhat staggered in the x direction. On the top, the NAND strings are connected along global bit lines (BL) spanning multiple such sub-divisions of the array that run in the x direction. Here, global common source lines (SL) also run across multiple such structures in the x direction and are connect to the sources at the bottoms of the NAND string, which are connected by a local interconnect (LI) that serves as the local common source line of the individual finger. Depending on the embodiment, the global source lines can span the whole, or just a portion, of the array structure. Rather than use the local interconnect (LI), variations can include the NAND string being formed in a U type structure, where part of the string itself runs back up.

To the right of FIG. 9 is a representation of the elements of one of the vertical NAND strings from the structure to the left. Multiple memory cells are connected through a drain select gate SGD to the associated bit line BL at the top and connected through the associated source select gate SDS to the associated local source line LI to a global source line SL. It is often useful to have a select gate with a greater length than that of memory cells, where this can alternately be achieved by having several select gates in series (as described in U.S. patent application Ser. No. 13/925,662, filed on Jun. 24, 2013), making for more uniform processing of layers. Additionally, the select gates are programmable to have their threshold levels adjusted. This exemplary embodiment also includes several dummy cells at the ends that are not used to store user data, as their proximity to the select gates makes them more prone to disturbs.

Figure 10:
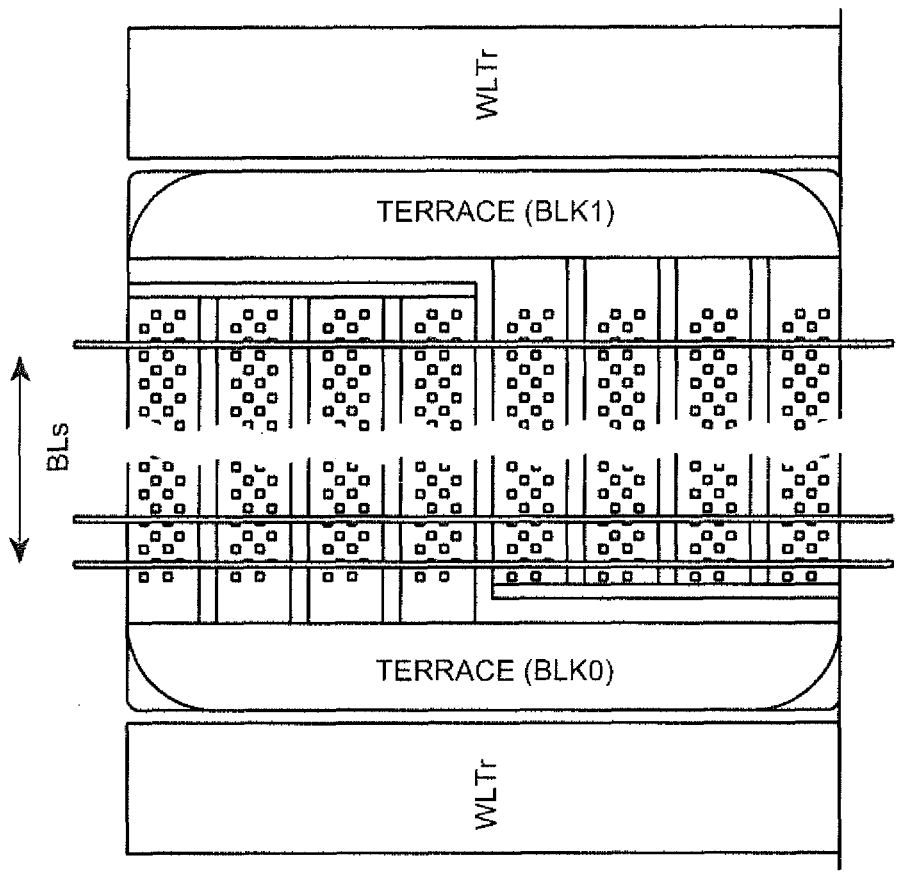

FIG. 10 shows a top view of the structure for two blocks in the exemplary embodiment. Two blocks (BLK0 above, BLK1 below) are shown, each having four fingers that run left to right. The word lines and select gate lines of each level also run left to right, with the word lines of the different fingers of the same block being commonly connected at a "terrace" and then on to receive their various voltage level through the word line select gates at WLTr. The word lines of a given layer in a block can also be commonly connected on the far side from the terrace. The selected gate lines can be individual for each level, rather common, allowing the fingers to be individually selected. The bit lines are shown running up and down the page and connect on to the sense amp circuits, where, depending on the embodiment, each sense amp can correspond to a single bit line or be multiplexed to several bit lines.

Figure 11:
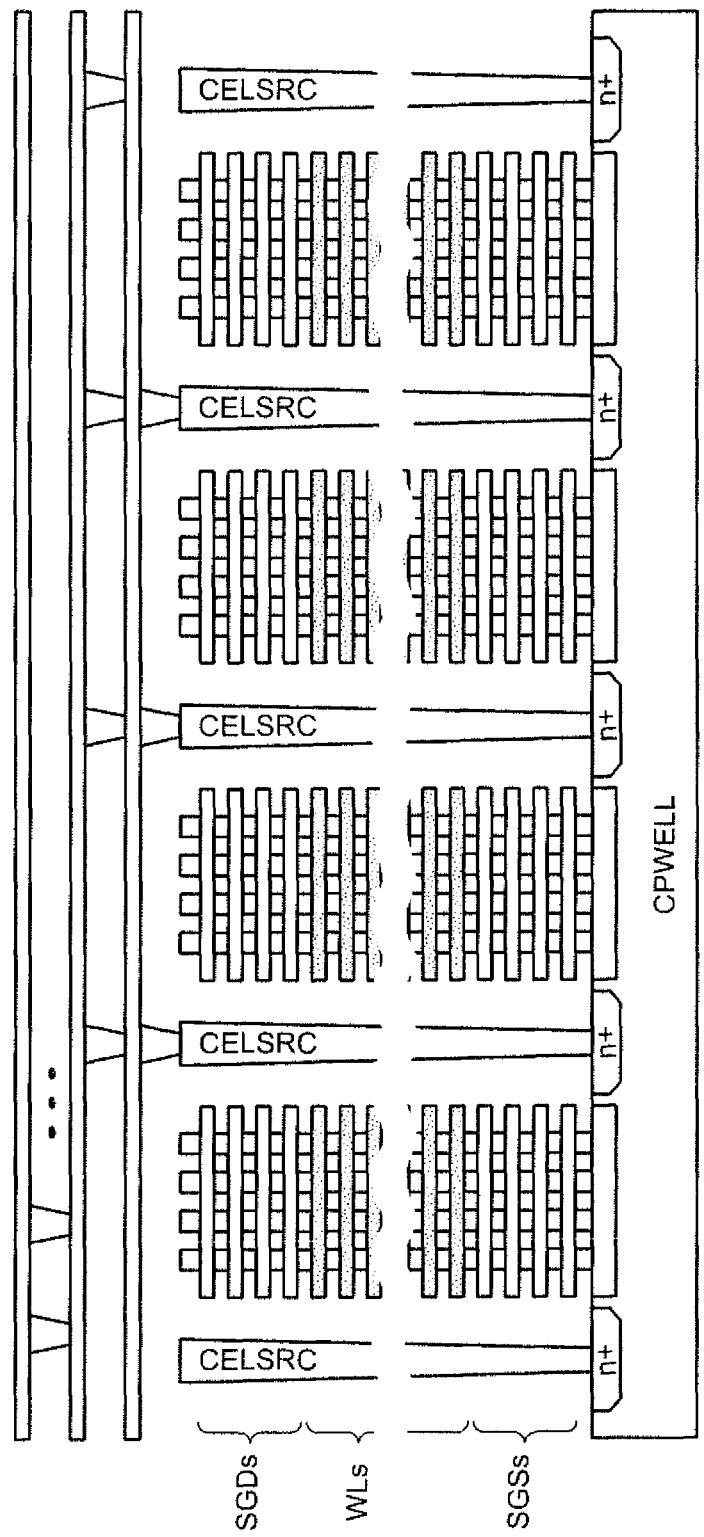

FIG. 11 shows a side view of one block, again with four fingers. In this exemplary embodiment, the select gates SGD and SGS at either end of the NAND strings are formed of four layers, with the word lines WL in-between, all formed over a CPWELL. A given finger is selected by setting its select gates to a level VSG and the word lines are biased according to the operation, such as a read voltage (VCGRV) for the selected word lines and the read-pass voltage (VREAD) for the non-selected word lines. The non-selected fingers can then be cut off by setting their select gates accordingly.

Figure 12:
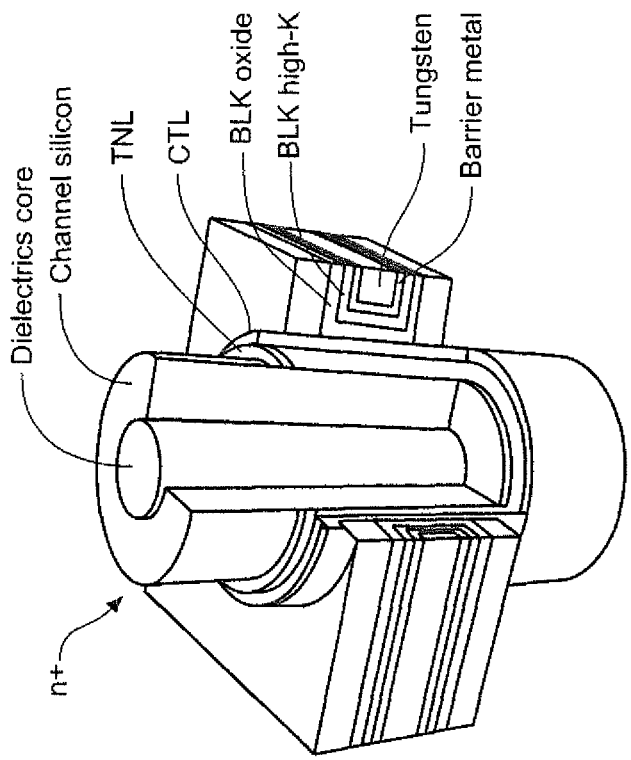

FIG. 12 illustrates some detail of an individual cell. A dielectric core runs in the vertical direction and is surrounded by a channel silicon layer, that is in turn surrounded a tunnel dielectric (TNL) and then the charge trapping dielectric layer (CTL). The gate of the cell is here formed of tungsten with which is surrounded by a metal barrier and is separated from the charge trapping layer by blocking (BLK) oxide and a high K layer.

Fast Adaptive Trimming for Memory Operating Parameters

In the operation of non-volatile memory devices, both those described above and also more generally, a number of parameters are involved. For instance, looking at the NAND memories described above, in a read operation there are the voltage levels associated with the different data states that applied to the selected word lines; different read levels sometimes used in binary read operations; the bias levels applied to non-selected word lines of the NAND strings, where these may differ depending on the location of the non-selected word lines; the level set on well structure; and so on. During write operations, during verify operations, there are the same sort of sensing parameters as for read operations, as well as the parameters associated with the pulse phase: the amplitude of pulses applied to selected word lines and the bias along bit lines, the well and non-selected word lines. Write operations can also have parameters associated with the maximum number of pulse, after how many pulses to start (and stop) verifying of different data states, how many failed bits to allow, and so on. Erase parameters can similarly include the erase voltage applied to the well, bit line levels, the number allowed erase loops, the number of loops in which erase-verify operations are skipped, and the number of failed bits ignored for erase-verify.

The optimal values used for these various parameters often depends on the amount of wear or operation conditions, where wear is often characterized in terms of number of program-erase cycles that a bock has experienced or other "health" measure related to a device's time left until end of life (EOL). As the NAND memory scales down, the controller needs to use different sets of trim values of these parameters for different blocks based on the amount of wear the block has been through, in order to meet the endurance and performance requirements. The number of parameters/trims that need to be updated for read/program/erase operations is increasing with every generation of NAND.

There are several techniques for dealing with this. The different parameter sets can be kept on the controller, such as in its ROM memory, and the controller can update the parameter values in NAND registers before every program/read/erase operation; however, this can cause performance loss as operations may be limited while the parameters are being transferred. An alternate arrangement is to have the NAND chip store multiple sets of each parameter that needs to be adaptively changed by the controller, where the controller then indicates which of these parameter sets can be picked by NAND for a particular program/read/erase operation. This approach causes a big area penalty in NAND and hence the number of parameters to be changed needs to be limited.

To improve upon this situation, in the techniques of this section the controller issues a sequence to input the data into transfer data latches associated with the bit lines before issuing read or erase commands. The data values here are the values of a fixed number of parameters that need to be updated for that particular read/erase operation. When this prefix sequence is issued, the parameter values get loaded into a fixed set of data latches in NAND. For example, if the memory intends to update 10 bytes of parameters, then 10 bytes of data transfer latches will be written into by the sequence.

Figure 13:
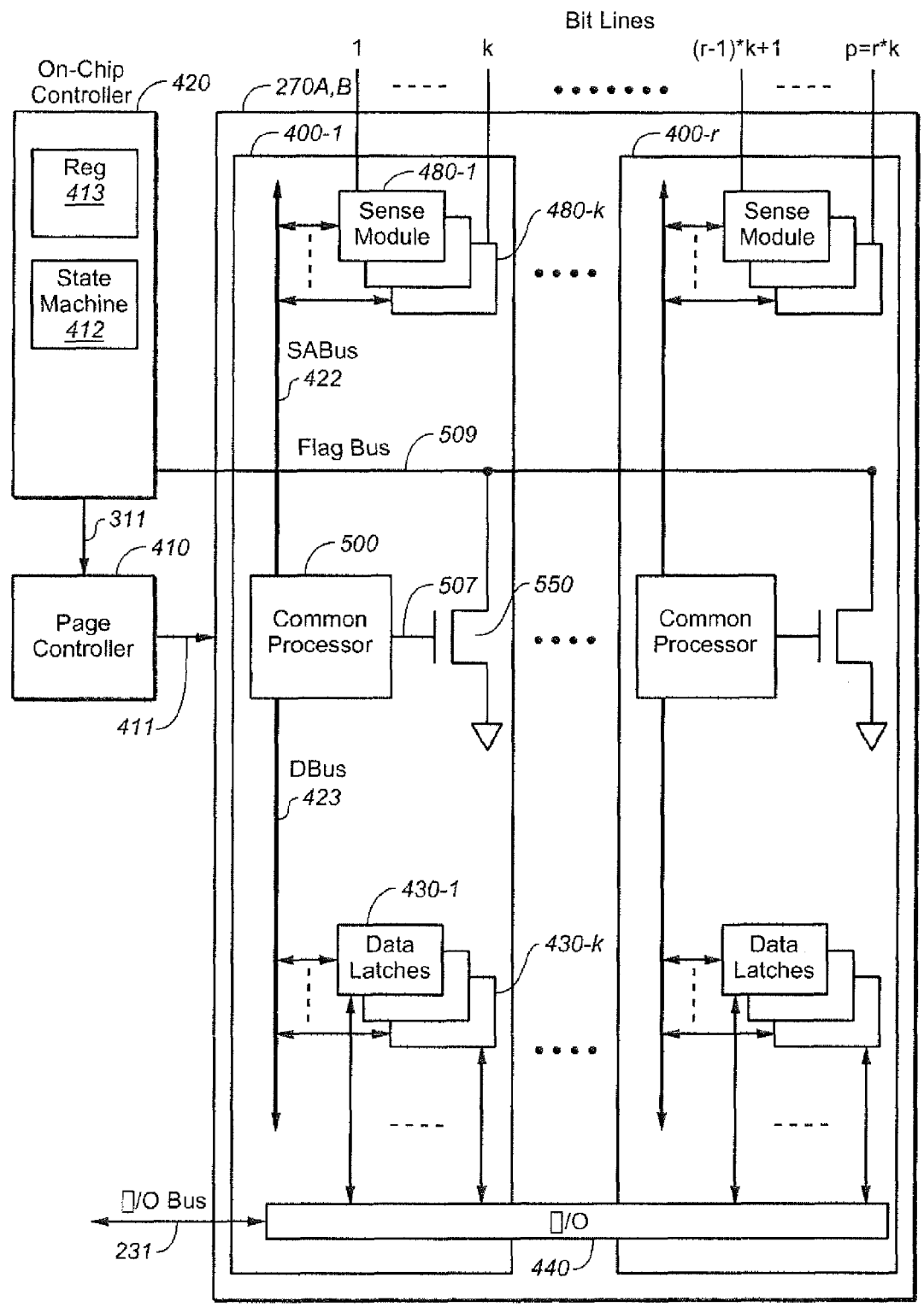
FIG. 13 illustrates portions of reading circuitry, including data latches, for an exemplary embodiment.

Before discussing the technique further, more detail on the data latch structure can be illustrated with respect to FIG. 13, which illustrates some detail for one embodiment for read/write stacks. Each read/write stack 400 operates on a group of k bit lines in parallel. If a page has p=r*k bit lines, there will be r read/write stacks, 400-1, . . . , 400-r. Essentially, the architecture is such that each stack of k sense modules is serviced by a common processor 500 in order to save space. The common processor 500 computes updated data to be stored in the latches located at the sense modules 480 and at the data latches 430 based on the current values in those latches and on controls from the state machine 412, that is part of the on-chip controller 420. Detailed description of the common processor has been disclosed in U.S. Patent Application Publication Number US-2006-0140007-A1. The entire bank of partitioned read/write stacks 400 operating in parallel allows a block (or page) of p cells along a row to be read or programmed in parallel. Thus, there will be p read/write modules for the entire row of cells. As each stack is serving k memory cells, the total number of read/write stacks in the bank is therefore given by r=p/k. For example, if r is the number of stacks in the bank, then p=r*k. One example memory array may have p=150000, k=8, and therefore r=18750.

Each read/write stack, such as 400-1, essentially contains a stack of sense modules 480-1 to 480-k servicing a segment of k memory cells in parallel. The page controller 410 provides control and timing signals to the read/write circuit 370 via lines 411. The page controller is itself dependent on the memory controller 310 via lines 311. Communication among each read/write stack 400 is effected by an interconnecting stack bus 431 and controlled by the page controller 410. Control lines 411 provide control and clock signals from the page controller 410 to the components of the read/write stacks 400-1. In one example, the stack bus is partitioned into a SABus 422 for communication between the common processor 500 and the stack of sense modules 480, and a DBus 423 for communication between the processor and the stack of data latches 430.

The stack of data latches 430 comprises of data latches 430-1 to **430-*k*, one for each memory cell associated with the stack The I/O module 440 enables the data latches to exchange data with the external via an I/O bus 231. These data latches 430**, each associated with a bit line of a page and connectable to the I/O bus, are for the transfer of data between the memory cells and the I/O bus, but are here additionally used for transfer of a set of operating parameters. When the data latches are used in this way, it is here referred to as "fast adaptive trim" mode.

A switch can be added into the NAND device to indicate that it is in fast adaptive trim mode. When this switch is ON, read/erase operations will transfer the parameter values from data transfer latches to the corresponding parameter registers on the NAND device before starting the READ/ERASE operations. The operation of transferring the parameters from XDL data latches to parameter registers can be executed in parallel to the high voltage ramp up operation, which is executed by the NAND at the beginning of a read/program/erase operation. This way there is no extra time penalty for the transfer.

A stand-alone variant of this mode can be designed such that the controller can issue a sequence of commands, addresses and data to load the data into transfer data latches and then NAND will go busy to transfer these values into parameter latches. Once the transfer is done and NAND returns to ready state, cache program sequence to program several pages of data can be performed using the updated trim.

Another variant of this mode can be designed such that the controller loads the parameter values and their complements into the data latches and the NAND device checks (using an XNOR operation) between each parameter value and its complement before loading it into the registers.

For any of these variations, the trimming of the operating parameters can be updated without any extra area penalty while giving better performance compared to the prior methods. The different trim values can be kept on the controller circuit, for example in its ROM memory (122, FIG. 1) and then transferred first to the data latches 430 and then into the registers (REG 413) of the on-chip controller 420 for use by the state machine 412 and other on-chip control logic during read, write, and erase operations.

Figures 14A, 14B:
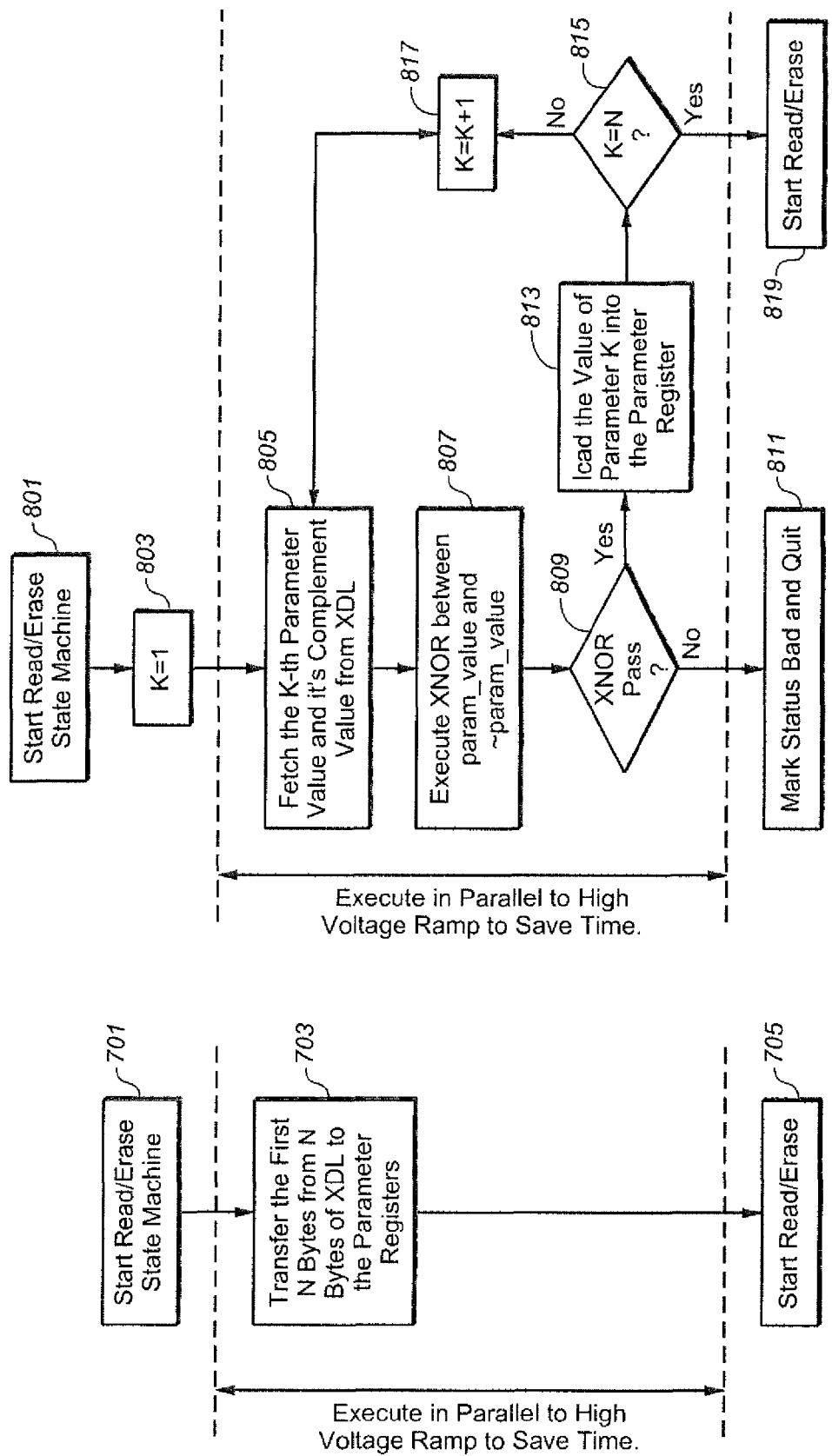
FIGS. 14A and 14B are flow charts for the loading of parameter values on to a memory circuit.

FIGS. 14A and 14B are flow charts to illustrate the loading of N bytes of parameter values in the NAND for the example of a read or erase operation. FIG. 14A is for the case without the XNOR check of the last paragraph. The flow begins at 701 with starting the read/erase state machine. The first N bytes are transferred from N bytes of the data latches to the parameter registers at 703, where this can be executed in parallel to the ramping up of high voltages to operating levels. At 705, the actual operation using the parameters begins.

FIG. 14B is a flow including the XNOR check for a read or erase operation. The flow begins with starting the state machine at 801 and setting a loop count K to 1 at 803. The following transfer and check operations can be executed in parallel to the ramping up of high voltages. At 805, the K-th parameter and its complement are fetched and XNOR-ed at 807 to see if it is corrupted at 809. If the parameter and its complement fail, the status is marked as bad and the process quit; if passed, the values of the parameter is loaded into the register at 813. At 815 the value of K is checked and if there are more values, K is incremented at 817 and the loop repeated; if K is at the final value (N), the operation can then start at 815.

Once the parameters are loaded, the command can be started. For example, in a read command, the command can include the parameter data, a prefix to distinguish between a normal read and adaptive trimmed read, and an address to be read. The parameters are transferred from the latches to the registers, and the specified page of date is read out into the sense amps. Meanwhile, a second such read command can be received and its parameters transferred from the latches to the registers. The first page of data can then be transferred from internal data latches to the XDL transfer latches, after which it can be sent out to the controller while the second page is read into to the sense amp and, once the first page is transferred out, a third such read command can be received.

In the case of an erase, the erase command sequence would include the parameter set, which is then transferred from the latches to the registers, after which the erase operation on the specified block or blocks is begun using the parameters.

For a write operation, as the data latches are used for sending page data, the controller does not send the set of operating parameters along with the command sequence for writing page data. Instead, the controller can first issue a sequence of commands to send the operating parameters into latches and write them into NAND registers in a "stand-alone" burst mode. Once this is done, the controller will issue a sequence of commands and the corresponding page data to be programmed into the array. Since the write operations are typically done sequentially and back to back on the same block, the controller can do a burst write of parameters once and then issue several back-to-back program operation commands in cache mode.

In terms of implementation, an added parameter or a prefix command can be used for the memory to distinguish this mode from normal read/erase modes. The parameters that can be changed using this mode can be grouped together to have sequential addressing. As described with respect to FIG. 14B, in a variant of this mode the controller loads the parameter values and their complements into XDL and NAND checks XNOR between them before loading the parameter values into the registers, where, in case of XNOR fail, the status should be marked "FAIL" (811, FIG. 14B). For writing, the stand-alone variant of this mode to support a latch to parameter function is useful, while in another variant, a set of temporary registers can be used instead of the latches for receiving the parameter values, where this set of temporary registers can be shared by different NAND functions to achieve better area utilization. In case of multi-plane operation, the parameter values can be sent to the latches of a specified plane, such as plane-0, while for single plane operation, the parameter values are sent into the selected planes latches.

CONCLUSION

The arrangement described in the preceding section has a number of advantages relative to previous arrangements. As it can change read/erase related parameters with minimal time penalty and on the fly, it allows for these trim values to be changed more frequently. Additionally, as there is no need to add extra registers on the memory circuit, this can be with area savings. Further, the controller can issue less commands, using less address cycles, relative to a typical parameter write and these parameter values can be loaded into the NAND memory at high speed as there are send into the data latches. Also, while the NAND memory is updating trims on one die in a multi-die package, the controller can choose to execute another operation in another die in the same package, thereby increasing parallelism and improving system performance.

The foregoing detailed description has been presented for purposes of illustration and description. It is not intended to be exhaustive or to limit the above to the precise form disclosed. Many modifications and variations are possible in light of the above teaching. The described embodiments were chosen in order to explain the principles involved and its practical application, to thereby enable others to best utilize the various embodiments and with various modifications as are suited to the particular use contemplated. It is intended that the scope be defined by the claims appended hereto.

It is claimed:

1. A non-volatile memory circuit, comprising:
   an array of non-volatile memory cells connected along bit lines;
   a data bus;
   read/write/erase circuitry connected to the array, including data latches connectable to the bit lines and data bus for transfer of data between the data bus and the array;
   registers for storing operating parameters; and
   control circuitry connected to the read/write/erase circuitry, wherein, in response to receiving a specified command sequence including a set of operating parameters, the memory circuit loads the received set of operating parameters into the data latches and subsequently transfers the received set of operating parameters from the data latches to the registers prior to executing by the read/write/erase circuitry of a subsequent portion of the specified command sequence using the received set of operating parameters.

2. The non-volatile memory circuit of claim 1, wherein the set of operating parameters is received in a data/data compliment format and the control circuitry checks the parameter values by comparing the operating parameter values with the respective complement values before transferring the operating parameter values to the registers.

3. The non-volatile memory circuit of claim 1, wherein the specified command sequence includes a command for reading a specified page of data and the set of operating parameters includes parameters for use in reading the specified page of data from the array to the data latches.

4. The non-volatile memory circuit of claim 3, wherein the specified page of data corresponds to memory cells along a first word line of the memory array and the set of operating parameters includes a voltage level applied to the first word line during the reading of the specified page of data.

5. The non-volatile memory circuit of claim 4, wherein the memory array is formed according to a NAND type architecture and the set of operating parameters includes voltage levels applied to others of the word lines of a NAND block to which the first word line belongs during the reading of the specified page of data.

6. The non-volatile memory circuit of claim 3, wherein the memory array is formed over a well structure and the set of operating parameters includes a voltage level to which the well is set during the reading of the specified page of data.

7. The non-volatile memory circuit of claim 1, wherein the specified command sequence includes a command specifying parameters for use in writing one or more pages of data specified by one or more subsequent commands of the sequence from the data latches to the array.

8. The non-volatile memory circuit of claim 7, wherein each of the specified pages of data corresponds to memory cells along a corresponding word line of the memory array and the set of operating parameters includes a voltage level of a programming pulse applied to the corresponding word line during the writing thereof.

9. The non-volatile memory circuit of claim 8, wherein the memory array is formed according to a NAND type architecture and the set of operating parameters includes voltage levels applied to word lines of a NAND block to which the programming pulse is not applied.

10. The non-volatile memory circuit of claim 7, wherein each of the specified pages of data corresponds to memory cells along a corresponding word line of the memory array and the set of operating parameters includes a voltage level of a verify operation applied to the corresponding word line during the writing thereof.

11. The non-volatile memory circuit of claim 10, wherein the memory array is formed according to a NAND type architecture and the set of operating parameters includes voltage levels applied to non-selected word lines of the NAND block during the verify operation,
   formed over a well structure and the set of operating parameters includes a voltage level to which the well is set during the writing one or more pages of data.

12. The non-volatile memory circuit of claim 1, wherein the specified command sequence includes a command for erasing a specified block of the memory array and the set of operating parameters includes parameters for use in erasing the specified block.

13. The non-volatile memory circuit of claim 12, wherein the memory array is formed over a well structure and the set of operating parameters includes a voltage level to which the well is set during the erasing of the specified block.

14. The non-volatile memory circuit of claim 12, wherein the set of operating parameters includes one or more voltage levels to which the bit lines set during the erasing of the specified block.

15. The non-volatile memory circuit of claim 12, wherein the erasing of the specified block including applying a number of erase voltage pulses and the set of operating parameters includes a maximum number of allowed pulses.

16. The non-volatile memory circuit of claim 15, wherein the set of operating parameters a number of pulses for which a subsequent erase verify operation is not included.

17. The non-volatile memory circuit of claim 15, wherein the set of operating parameters a number maximum number of failed bits for the erasing the specified block.

18. The non-volatile memory circuit of claim 1, wherein the array is formed according to a NAND type architecture.

19. The non-volatile memory circuit of claim 18, wherein the memory circuit is a monolithic two-dimensional semiconductor memory device where the memory cells are arranged in a single physical level above a silicon substrate and comprise a charge storage medium.

20. The non-volatile memory circuit of claim 18, wherein the memory circuit is a monolithic three-dimensional semiconductor memory device where the memory cells are arranged in multiple physical levels above a silicon substrate and comprise a charge storage medium and the bit lines run in a horizontal direction relative to the substrate.

21. A non-volatile memory system, comprising:
   a memory circuit, comprising:
   an array of non-volatile memory cells connected along bit lines;
   a data bus;
   read/write/erase circuitry connected to the array, including data latches connectable to the bit lines and data bus for transfer of data between the data bus and the array;
   registers for storing operating parameters; and read/write/erase control logic connected to the read/write/erase circuitry, and a memory controller circuit connected to the memory circuit to control the transfer of data between the memory circuit and a host connected to the memory system and to manage the storage of data on the memory circuit, wherein, in response to memory circuit receiving from the memory controller circuit a specified command sequence including a set of operating parameters, the memory circuit loads the received set of operating parameters into the data latches and subsequently transfers the received set of operating parameters from the data latches to the registers prior to executing by the read/write/erase circuitry of a subsequent portion of the specified command sequence using the received set of operating parameters.

22. The non-volatile memory system of claim 21, wherein the set of operating parameters is received in a data/data compliment format and the control circuitry checks the parameter values by comparing the operating parameter values with the respective complement values before transferring the operating parameter values to the registers.

23. The non-volatile memory system of claim 21, wherein the specified command sequence includes a command for reading a specified page of data and the set of operating parameters includes parameters for use in reading the specified page of data from the array to the data latches.

24. The non-volatile memory system of claim 21, wherein the specified command sequence includes a command specifying parameters for use in writing one or more pages of data specified by one or more subsequent commands of the sequence from the data latches to the array.

25. The non-volatile memory system of claim 21, wherein the specified command sequence includes a command for erasing a specified block of the memory array and the set of operating parameters includes parameters for use in erasing the specified block.

26. The non-volatile memory system of claim 21, wherein the array is formed according to a NAND type architecture.

27. The non-volatile memory system of claim 26, wherein the memory circuit is a monolithic two-dimensional semiconductor memory device where the memory cells are arranged in a single physical level above a silicon substrate and comprise a charge storage medium.

28. The non-volatile memory system of claim 26, wherein the memory circuit is a monolithic three-dimensional semiconductor memory device where the memory cells are arranged in multiple physical levels above a silicon substrate and comprise a charge storage medium and the bit lines run in a horizontal direction relative to the substrate.

29. The non-volatile memory system of claim 21, wherein the memory controller circuit maintains multiple sets of operating parameters from which the memory controller circuit selects the received set of operating parameters.

30. The non-volatile memory system of claim 21, wherein the memory controller maintains counts of the number of programming cycles experienced by physical addresses of the memory array and selects the received set of operating parameters based upon the number of programming cycles experienced by a physical address specified by the subsequent portion of the specified command sequence.

31. The non-volatile memory system of claim 21, wherein the memory controller maintains counts of the number of programming cycles experienced by physical addresses of the memory array and selects the received set of operating parameters based upon a bit error rate associated with a physical address specified by the subsequent portion of the specified command sequence.

* * * * *